United States Patent [19]

Au

[11] Patent Number: 4,477,886

[45] Date of Patent: Oct. 16, 1984

[54] SENSE/RESTORE CIRCUIT FOR DYNAMIC RANDOM ACCESS MEMORY

[75] Inventor: Alexander C. Au, Los Altos, Calif.

[73] Assignee: Fairchild Camera & Instrument Corporation, Mountain View, Calif.

[21] Appl. No.: 352,967

[22] Filed: Feb. 26, 1982

[51] Int. Cl.³ .............................................. G11C 13/00
[52] U.S. Cl. ..................................... 365/222; 365/203
[58] Field of Search ................................ 365/222, 203

[56] References Cited

U.S. PATENT DOCUMENTS 3,737,879 6/1973 Greene et al. ...................... 365/222

Primary Examiner—Terrell W. Fears

Attorney, Agent, or Firm—Ronald C. Fish; Kenneth Olsen; Carl L. Silverman

[57] ABSTRACT

In a capacitive storage integrated circuit dynamic random access memory having a cross-coupled transistor sense amplifier coupled to a bit line wherein capacitive storage cells are coupled to the bit line through transistor transfer gates, means are provided for restoring charge on the capacitive storage cell by recharging the memory cells directly rather than through the bit lines. Specifically, each storage cell has one terminal coupled to one electrode terminal of the transistor transfer gate and its other terminal coupled to a switched voltage reference. The storage cell is not referenced to a fixed ground level.

4 Claims, 3 Drawing Figures

SENSE/RESTORE CIRCUIT FOR DYNAMIC RANDOM ACCESS MEMORY

BACKGROUND OF THE INVENTION

1. Field of Invention

This invention relates to integrated circuit dynamic random access memories and in particular it relates to the circuitry for restoring the charge level in storage cells of a dynamic random access memory (dynamic RAM). The invention has particular application to metal oxide semiconductor (MOS) dynamic random access memory technology. In a dynamic random access memory, digital information is stored in the form of capacitance in a storage cell which can be addressed and sensed by conventional external circuitry. The charge increments in a group of selected storage cells are generally sensed by a set of cross-coupled transistor pairs each operative as a sense amplifier. The sense amplifier senses the charge on a capacitor in a memory cell by drawing off a portion of the charge during the sensing operation. Consequently, the signal level stored on the memory capacitor is degraded substantially after sensing is completed. Voltage degradation on the order of twenty percent of the maximum signal is typical.

Various circuits have been proposed to restore the charge on the memory cell to the maximum charge level. Among the proposed solutions are circuits for recharging the bit line while the transfer gate between the memory cell and bit line is on. Such charge restoration circuits have a number of disadvantages. For example, since the bit lines are very highly capacitively loaded when the transfer gates are on, charge restoration through the bit lines requires high power consumption and/or a relatively long time to recharge the cell. Second, since the charge restoration generally takes place through a transfer gate transistor, steps must be taken to assure that the transfer gate is fully on to assure maximum charge transfer to the storage cell. Consequently, the gating signal to the transfer gate transistor, typically designated the word line, must be held to a voltage level at least one threshold voltage level (diode drop) above the desired charging level. Finally, great care and attention must be given to the timing circuitry and control clocks to assure proper synchronization of the restore circuitry and the transfer gate driving circuitry.

What is needed is a circuit technique whereby the memory cell can be fully recharged without the identified disadvantages.

2. Description of the Prior Art

The operation of dynamic random access memories with a cross-coupled type of sense amplifier using a dummy cell and a capacitance storage cell is widely known and taught elsewhere. A few examples are U.S. Pat. No. 3,514,765 to Christensen entitled "Sense Amplifier Comprising Cross-coupled MOSFET's Operating in a Race Mode for Single Device Per Bit MOSFET Memories"; U.S. Pat. No. 3,678,473 to Wahlstrom entitled "Read-Write Circuit for Capacitive Memory Arrays"; a paper by John J. Barnes and John Y. Chan entitled "A High Performance Sense Amplifier for a 5V Dynamic RAM", published in *IEEE Journal of Solid-State Circuits*, Vol. SC-15, October 1980, pp. 831–838; a paper by Lee et al. entitled "A 80 ns 5V-Only Dynamic RAM", published in *ISSCC Digest of Technical Papers*, February 1979, pp. 146–147; and a paper by White et al. entitled "A 5V-Only 64K Dynamic RAM", in *ISSCC Digest of Technical Papers*, February 1980, pp. 230–231. These publications are representative of the developments in the state of the art related to sense amplifiers and dynamic random access memories.

SUMMARY OF THE INVENTION

According to the invention, in a capacitive storage integrated circuit dynamic random access memory having a cross-coupled transistor sense amplifier coupled to a bit line wherein capacitive storage cells are coupled to the bit line through transistor transfer gates, means are provided for restoring charge on the capacitive storage cell by recharging the memory cells directly rather than through the bit lines. Specifically, each storage cell has one terminal coupled to one electrode terminal of the transistor transfer gate and another terminal coupled to a switched voltage reference designated $\phi_{Ri}$. The control line of the reference $\phi_{Ri}$ is coupled in common with each row of storage cells so that only the $\phi_{Ri}$ line of the select row of memory cells is activated when it is desired to restore the charge on a memory cell following a sense operation. The storage cell is not referenced to a fixed ground level as is the case with known prior art.

The storage cell and charge restoration scheme according to the invention has a number of advantages. For example, this scheme allows a substantial increase in the storage signal (on the order of 100 or more percent). Second, this scheme reduces the normal power dissipation, since voltage restoration is performed directly on the memory bits themselves rather than by means of the bit lines which are normally heavily capacitively loaded. Third, this scheme reduces the layout complexity of the sense amplifier as compared with typical prior art schemes.

The invention will be better understood by reference to the following detailed description taken in connection with the accompanying figures.

DETAILED DESCRIPTION OF SPECIFIC EMBODIMENTS

Figure 1:
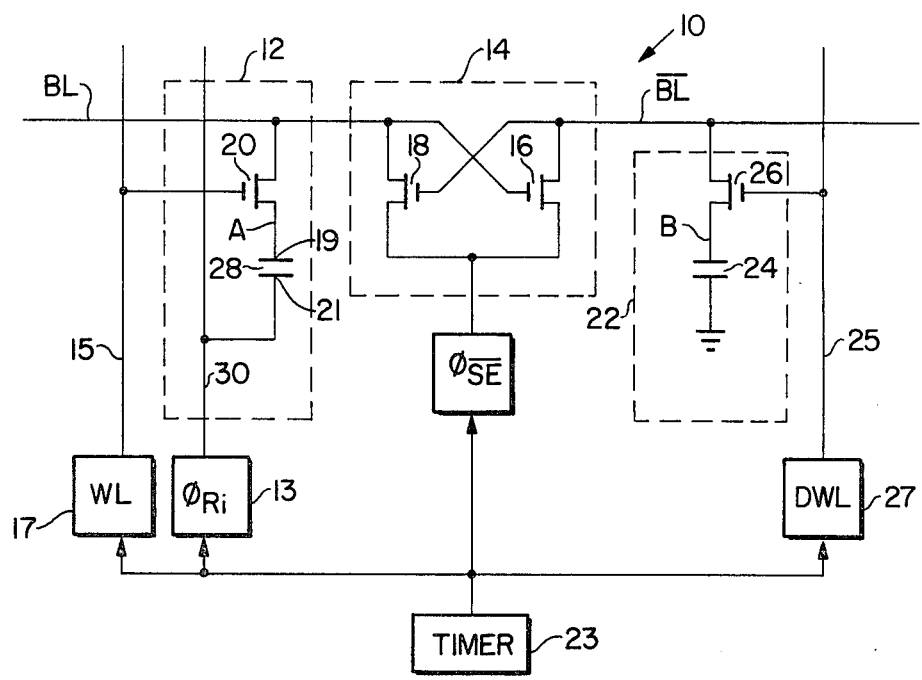
FIG. 1 is a schematic diagram of a portion of a dynamic random access memory showing a memory cell according to the invention.

Turning to FIG. 1 there is shown a segment of a dynamic random access memory 10 with a memory cell 12 and voltage reference 13 according to the invention. An effort has been made to identify various elements of the circuit with the terminology commonly used in the published literature. For example, BL refers to the bit line or column conductor for memory cells 12. The column conductor or bit line BL is connected to one arm of a sense amplifier 14 which is formed by a cross-coupled transistor pair 16, 18. The conduit by which individual transfer gates 20 are turned on and off is the word line 15. The word line couples a word line voltage source 17 to a row of gate electrodes for transistor transfer gates 20. The conductor connected to the arm of the sense amplifier 14 opposite the bit line BL is called the inverted bit line $\overline{BL}$. Memory cells are also connected to the arm $\overline{BL}$. More importantly, however, a dummy cell 22 comprising a storage capacitor 24 and a dummy cell transfer gate 26 are coupled to the complement bit line $\overline{BL}$ through one electrode of the dummy cell transfer gate 26. A dummy word line 25 driven by a DWL clock 27 is coupled to the control electrode of the dummy transfer gate 26, as well as to control electrodes of other dummy transfer gates (not shown) in the same row. The sense amplifier 14 is normally activated, i.e., clocked, by applying a signal to the common source electrode coupling of the cross-coupled transistor pair 16, 18 in the form of a clock signal $\phi_{\overline{SE}}$.

Each storage cell 12 includes a storage capacitor 28. Conventionally, and according to the prior art, one terminal 19 at point A of the storage capacitor 28 is coupled to one electrode of the transister gate 20 by which the storage capacitor 28 is coupled to the bit line BL while the other capacitor terminal 21 would be coupled to the ground reference. However, according to the invention, the second terminal 21 of the storage capacitor 28 is coupled to a reference line 30 whose voltage is controlled by a clock reference voltage source 13 designated $\phi_{Ri}$. The reference source $\phi_{Ri}$ is controlled in such a manner by a master timer 23 to provide a ground reference when the storage cell 12 is addressed and sensed by the sense amplifier bit line BL and otherwise to provide a charging voltage for the storage capacitor 28. Each row of storage cells 12 has its own reference line 30. Thus each row of storage cells 12 may be separately restored to its intended operating voltage.

Figure 2:
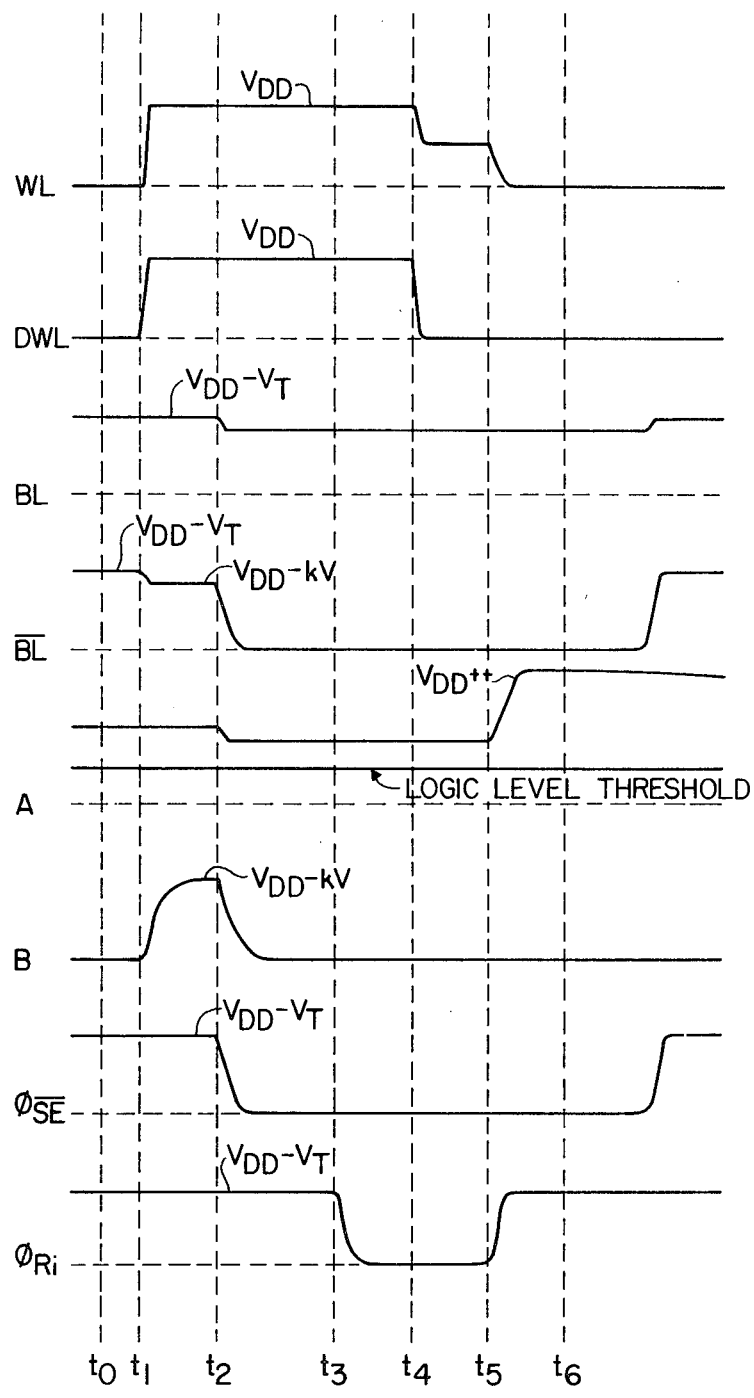
FIG. 2 is a timing diagram for a first read operation.

Turning to FIG. 2, there is shown a timing diagram for reading a logic one according to the operation of the invention shown in FIG. 1. In the initial state, the word line 15 driven by WL clock 17, dummy word line 25 driven by DWL clock 27 and dummy cell storage node B are precharged to zero volts relative to ground. Hence, there is no charge across the dummy storage capacitor 24. In addition, the bit line BL, complement bit line $\overline{BL}$, and the sense amplifier clock $\phi_{\overline{SE}}$ are all precharged to a level of one threshold voltage below the reference supply voltage, or $V_{DD}-V_T$. This charge level is the consequence of a conventional precharge circuit which is not shown. The storage node A of the storage capacitor 28 in the storage cell 12 is precharged to a logical one signal level relative to ground, or about five volts in a conventional dynamic RAM. The charge restoration clock $\phi_{Ri}$ precharges the restore line 30 to five volts.

It is desired to read the logic one value stored at node A across the storage capacitor 28. In order to start the sequence to do so, both the word line 15 and dummy word line 25 are charged high to the supply level at time $t_1$ as shown in FIG. 2, thereby turning on the transfer gates 20 and 26 of the memory cell 12 and dummy cell 22, respectively. Charge sharing occurs between the bit line BL and node A and also between the complement bit line $\overline{BL}$ and node B. Since the logical one stored at node A is substantially the same as the voltage on the bit line BL, both the bit line BL and node A remain substantially at the supply level $V_{DD}-V_T$.

However, the inverted bit line $\overline{BL}$ and node B must equalize in charge, resulting in a change in voltage from their initial states. Thus, the complement bit line $\overline{BL}$ and node B equalize to a voltage level of $V_{DD}-kV$.

Thereafter at time $t_2$, the sense clock $\phi_{\overline{SE}}$ is activated to draw the voltage at the common node of the transistor pair 16, 18 to zero volts. Initially, this causes the transistors 16, 18 of the sense amplifier 14 to begin to conduct, thereby causing both the bit line BL and the complement bit line $\overline{BL}$ to begin to discharge. However, since the initial voltage on the bit line BL is higher than the initial voltage on the complement bit line $\overline{BL}$, the discharge rate of the complement bit line $\overline{BL}$ will be somewhat faster than the discharge rate of the bit line BL. Eventually, the gate electrode of transistor 18 will drop below the threshold level, turning off the transistor 18 and latching the transistors 16 and 18 respectively in an ON and OFF state. The discharge of the bit line BL is terminated while the discharge of the complement bit line $\overline{BL}$ continues until the charge across the capacitor 24 is zero. The voltage on the bit line BL stabilizes at a level somewhat below the supply voltage.

The sense portion of the cycle is now terminated and a restoration portion of the cycle begins. At time $t_3$, the clock line 30 is discharged to zero voltage reference. However, the word line 15 remains high so that the transfer gate transistor 20 remains on. Node A is thereby coupled to the bit line, and very little voltage coupling takes place between node A and the cell reference line 30.

At time $t_4$, the read cycle terminates with the discharge of the dummy word line 25, thereby turning off the dummy transfer gate 26. In addition, the word line 15 is discharged to approximately fifty to sixty percent of the supply voltage level. The transfer gate 20 is thus turned off because of the positive voltage differential across the storage capacitor 28. Node A is thus isolated from the bit line BL.

At time $t_5$, the reference line 30 is recharged to about the supply voltage. Since node A is isolated from the bit line, it is free to be driven high through the reference line 30 voltage source $\phi_{Ri}$. Hence, the voltage level at node A goes to approximately twice the supply level, less the voltage lost due to charge sharing.

At time $t_6$, the word line 15 is fully discharged to zero volts, thus completing the cycle. The charge across the capacitor 28 is now substantially above the minimum level necessary for a logic one. Memory cell 12 can be safely read again without concern for loss of noise immunity.

Figure 3:
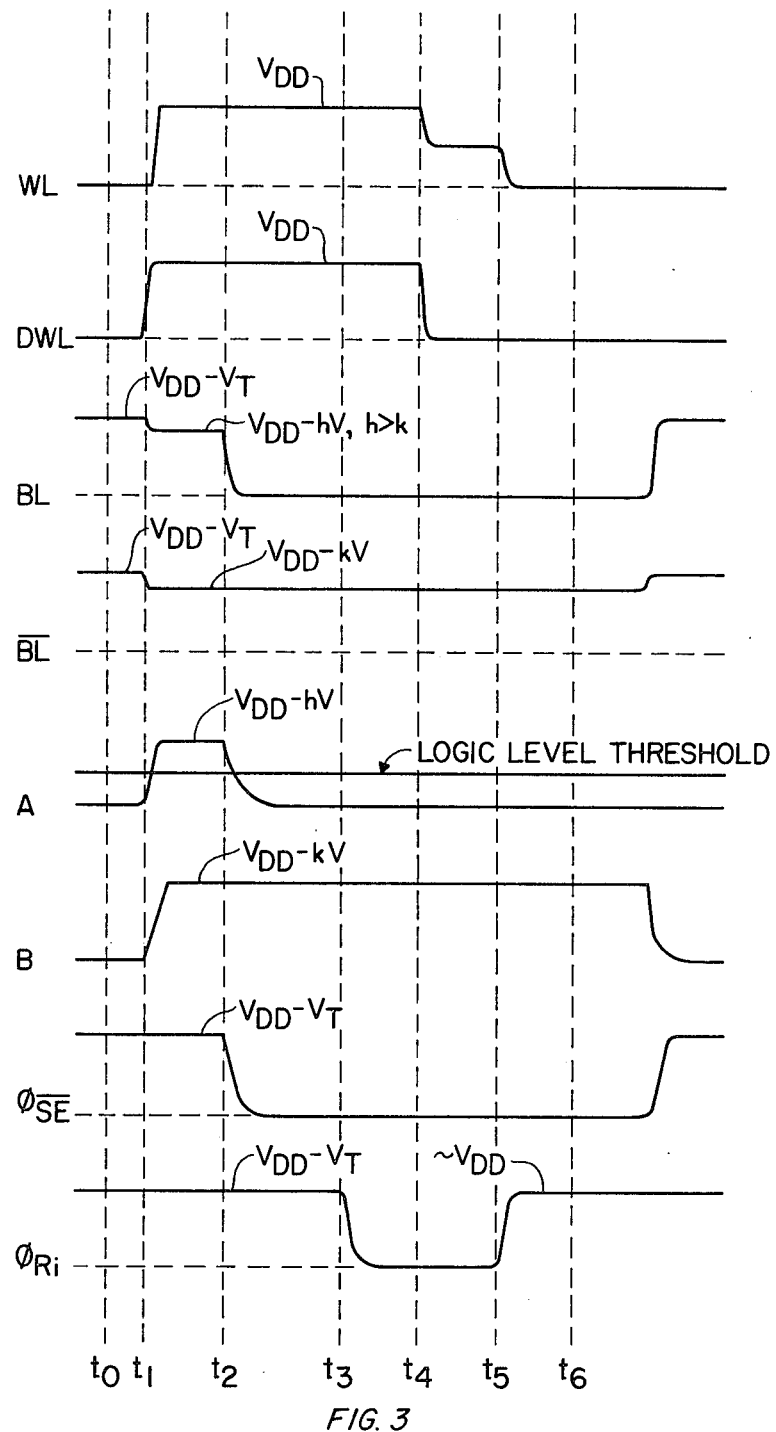
FIG. 3 is a timing diagram for a second read operation.

Turning to FIG. 3, there is shown a timing diagram for the same circuit when reading a logic zero stored in the memory capacitor 28. With node A initially set at a logical zero, which may be represented by zero volts relative to ground, all other initial conditions are the same as in the previously described read operation. At time $t_1$, both the word line and dummy word line are charged up to the supply level. Transistors 20 and 26 are turned on, which causes charge sharing between the bit line BL and node A, as well as between the complement bit line $\overline{BL}$ and node B.

Because of the charge sharing between node A and bit line BL, the voltage level relative to ground at node A increases substantially. Similarly, the charge level at node B increases substantially. At time $t_2$, the sense clock $\phi_{\overline{SE}}$ is activated to drive the common source electrode connections of transistors 16 and 18 to a zero voltage level thereby to turn them on and to cause bit line BL and complement bit line $\overline{BL}$ to begin to discharge. However, under these conditions, the charge at node A will be less than the charge at node B. This differential is sensed by the sense amplifier 14, causing transistor 18 to latch on while transistor 16 is latched off. With transistor 18 turned on, node A is discharged through the transfer gate 20 and sense amplifier transistor 18 to the voltage level of the sense clock $\phi_{\overline{SE}}$. Once the circuit has settled, external means can sense the logic level at node A, which in this case will be a logic zero.

At time $t_3$, the voltage source $\phi_{Ri}$ discharges the cell reference line 30 to zero volts. The voltage at node A does not change because it is tied to ground through the transistor 18. At time $t_4$, the read cycle is completed and the bit line BL stands discharged while the inverted bit line remains substantially charged. The word line 15 is partially discharged, but the transfer gate 20 remains on. At time $t_5$, the charge restoration clock is returned to its high voltage level while node A is held at zero volts by the bit line BL, which in turn is held to the ground level through the sense amplifier 14. The zero logic level signal is thereby preserved at node A.

The invention has now been explained with reference to specific embodiments. Other embodiments will be apparent to those of ordinary skill in the art. It is therefore not intended that this invention be limited except as indicated by the appended claims.

I claim:

1. In an integrated circuit memory device wherein a capacitive storge memory cell having a first terminal and a second terminal is coupled at said first terminal through a transfer gate to a bit line, the improvement for recharging said memory cell, comprising:

decoupling means coupled to said transfer gate for decoupling said first terminal from said bit line, said decoupling means including a word line voltage source for varying the magnitude of a charge on a word line connected to said transfer gate to thereby control the conduction of said transfer gate; and setting means coupled to said second terminal for setting a voltage level at said second terminal independently of said bit line alternatively to a first voltage level for recharging said memory cell during a restoration cycle, and to a second voltage level for reference during a read cycle, said memory cell being solely dependent for refreshing on said setting means voltage level during said restoration cycle.

2. The memory device of claim 1, wherein a timer is connected to said memory device to provide a clock pulse to said word line voltage source.

3. In a memory device according to claim 1, the improvement wherein said voltage setting means is operative to provide a reference level for said memory cell at a voltage level other than ground level when said transfer gate is active.

4. In a memory device according to claim 3, the improvement wherein said voltage setting means is operative to set a voltage level at a level when said transfer gate is active which is sufficient to cause said transfer gate to become reverse biased when said transfer gate is deactivated.

* * * * *